(12) United States Patent
Tonti et al.

(10) Patent No.: US 8,112,729 B2
(45) Date of Patent: Feb. 7, 2012

(54) METHOD AND SYSTEM FOR SELECTIVE STRESS ENABLEMENT IN SIMULATION MODELING

(75) Inventors: William Robert Tonti, Essex Junction, VT (US); Richard Quimby Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 297 days.

(21) Appl. No.: 12/426,342

(22) Filed: Apr. 20, 2009

(65) Prior Publication Data

US 2010/0269075 A1 Oct. 21, 2010

(51) Int. Cl.
G06F 17/50 (2006.01)
(52) U.S. Cl. ....................................... 716/110
(58) Field of Classification Search ............. 716/100, 716/110
See application file for complete search history.

(56) References Cited

U.S. PATENT DOCUMENTS

| | | | |
|---|---|---|---|
| 7,032,193 B1 | 4/2006 | Hill | |
| 7,032,194 B1 | 4/2006 | Hsueh et al. | |
| 7,202,513 B1 | 4/2007 | Chidambarrao et al. | |
| 7,285,826 B2 | 10/2007 | Doris et al. | |
| 2006/0142987 A1 | 6/2006 | Ishizu et al. | |
| 2007/0028195 A1* | 2/2007 | Chidambarrao et al. | 716/2 |
| 2007/0204243 A1 | 8/2007 | Ito et al. | |
| 2007/0204250 A1 | 8/2007 | Moroz et al. | |
| 2007/0262385 A1 | 11/2007 | Nguyen et al. | |
| 2009/0217217 A1* | 8/2009 | Lin et al. | 716/2 |

* cited by examiner

Primary Examiner — Suchin Parihar
(74) Attorney, Agent, or Firm — Schmeiser, Olsen & Watts; Richard M. Kotulak

(57) ABSTRACT

A method and system for modeling an integrated circuit. The method includes converting a representation of the integrated circuit into design shapes of design levels of a design of the integrated circuit; adding control shapes to the design, the control shapes not defining any physical part of the integrated circuit; extracting layout-dependent stress parameters of the devices from the design levels of the design based on the control shapes and the design shapes; converting the layout-dependent stress parameters to stress parameters using a stress algorithm; generating stressed device parameters from the stress parameters using a compact model; and simulating performance of the integrated circuit using the stressed device parameters in a simulation model of the integrated circuit design.

25 Claims, 9 Drawing Sheets

METHOD AND SYSTEM FOR SELECTIVE STRESS ENABLEMENT IN SIMULATION MODELING

FIELD OF THE INVENTION

The present invention relates to a technique for selective enablement of engineered stress in semiconductor devices for the modeling of integrated circuits.

BACKGROUND OF THE INVENTION

Introducing stress into semiconductor devices using engineered stress elements has become an increasing popular method to improve the performance of integrated circuits. However, adding the effect of such stress to the circuit simulation steps of the integrated circuit design process can be very computer time and resource intensive depending on the restrictions of the methods of implementation, often unacceptably slowing down the design process. Accordingly, there exists a need in the art to mitigate the deficiencies and limitations described hereinabove.

SUMMARY OF THE INVENTION

A first aspect of the present invention is a method for modeling an integrated circuit having devices, comprising: a method for modeling an integrated circuit having devices, comprising: (a) converting, by processors of one or more computer systems, a representation of the integrated circuit into design shapes of design levels of a design of the integrated circuit; (b) adding, by the processors of the one or more computer systems, control shapes to the design, the control shapes not defining any physical part of the integrated circuit; (c) extracting, by the processors of the one or more computer systems, layout-dependent stress parameters of the devices from the design levels of the design based on the control shapes and the design shapes, the devices including one or more engineered stress elements; (d) converting, by the processors of the one or more computer systems, the layout-dependent stress parameters to stress parameters using a stress algorithm; (e) generating, by the processors of the one or more computer systems, stressed device parameters from the stress parameters using a compact model; and (f) simulating, by the processors of the one or more computer systems, performance of the integrated circuit using the stressed device parameters in a simulation model of the integrated circuit design.

A second aspect of the present invention is a computer system comprising a processor, an address/data bus coupled to the processor, and a computer-readable memory unit coupled to communicate with the processor, the memory unit containing instructions that when executed by the processor implement a method for modeling method an integrated circuit having devices, the devices including one or more engineered stress elements, the method comprising the computer-implemented steps of: (a) converting a representation of the integrated circuit into design shapes of design levels of a design of the integrated circuit; (b) adding control shapes to the design, the control shapes not defining any physical part of the integrated circuit; (c) extracting layout-dependent stress parameters of the devices from the design levels of the design based on the control shapes and the design shapes; (d) converting the layout-dependent stress parameters to stress parameters using a stress algorithm; (e) generating stressed device parameters from the stress parameters using a compact model; and (f) simulating performance of the integrated circuit using the stressed device parameters in a simulation model of the integrated circuit design.

A third aspect of the present invention is a system for modeling an integrated circuit comprising devices, the devices having one or more engineered stress elements inducing stress into the devices, the system comprising: means for adding control shape data representing control shapes to a computer readable representation of the integrated circuit, the representation of the integrated circuit including computer readable representations of physical designs of the devices, the control shapes not defining any physical part of the integrated circuit; means for processing the representations of the physical designs of the devices and generating layout-dependent stress parameters of the devices based on the control shape data and the representations of physical designs of the devices; means for receiving the layout-dependent stress parameters and computing stress parameters for the device; means for determining nominal stress parameters for devices not having engineered stress elements; means for generating stressed device parameters from the stress parameters and from the nominal stress parameters; means for selecting, from the nominal stress parameters, nominal device parameters for devices for which no layout-dependent stress parameters were extracted; and means for simulating performance of the integrated circuit based on the stressed device parameters and the nominal device parameters.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The embodiments of the present invention reduce the computer time and resource required to determine changes in device parameters due to engineered stress elements when layout changes are made during the design process. Exemplary engineered stress elements include deposited films (e.g., silicon nitride films) with intrinsic tensile or compressive stress that is induced by the deposition process used to form the films. Exemplary engineered stress elements also include heterostructure materials which are materials having heteroatoms such as (e.g., germanium) introduced into the lattice of crystalline materials (e.g., silicon), thereby stressing the material. Heterostructure materials (e.g., silicon germanium) may be used in the source and drain regions of field effect transistors (FETs). Devices include semiconductor (in particular single-crystal semiconductor and more particularly single-crystal silicon) FETs, bipolar transistors, diodes, resistors and capacitors. In particular, the embodiments of the invention account allow for selective inclusion or exclusion of devices and/or of devices in selected regions of an integrated circuit from the stress calculation steps of the integrated circuit design process using control shapes. In one implementation of control shape methodology, control shapes are processed by an extraction tool that filters out certain shapes by intersection, union, etc. types of operations. In a second implementation of control shape methodology, control shapes information is recorded during extraction and the information is passed as a series of parameters to a compact model (e.g., no stress is applied or not applied by the stress algorithms to design shapes based on the value of the parameter passed. A third implementation of control shape methodology includes a combination of both the first and second implementations.

Figure 1:
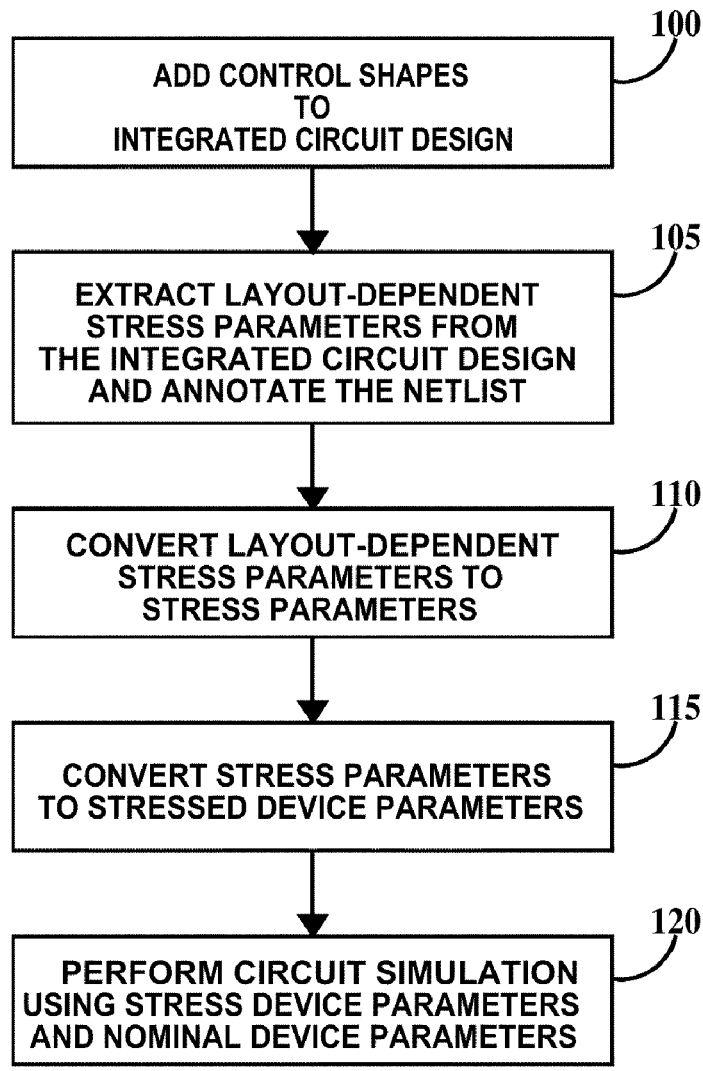
FIG. 1 is a flowchart of the general method of the embodiments of the present invention.

FIG. 1 is a flowchart of the general method of the embodiments of the present invention. In step 100, control shapes are added to a non-design level of an integrated circuit design to control whether or not engineered stress is taken into account in circuit simulation for specified design shapes. A non-design level is defined as a level that is not converted to a photomask used to fabricate the integrated circuit and is not part of the functional design of the integrated circuit chip. A first type of dummy design shape is defined as shape(s) in a design level that is converted to a photomask used to fabricate the integrated circuit but is not part of the functional (e.g., electrical) design of the integrated circuit chip. A second type of dummy shape is defined as a shape(s) added to a macro design during the design phase of the macro to improve simulation modeling of the macro (by simulating the environment of the macro when placed in a full integrated circuit design), but are removed from the final design of the macro. Control shapes do not define any physical part of the integrated circuit, they only enable or disable layout-dependent stress analysis. Examples of control shapes are illustrated in FIGS. 2A, 2B, 2C, 2D, 2E and 2F and described infra. In step 105, a netlist and layout-dependent stress parameters are extracted from the integrated circuit design using a modified extraction program and the layout-dependent stress parameters are annotated to the netlist. Examples of layout-dependent stress parameters are illustrated in FIG. 3 and described infra. In step 110, the layout-dependent stress parameters are converted to stress parameters using a stress algorithm. In step 115, the stress parameters are converted to stressed device parameters using a compact model. In step 120, a circuit simulation is performed using the stressed device parameters as input to a simulation model as well as nominal device parameters (i.e., parameters of devices that do not include engineered stress elements and do not include stress effects above those nominally present) for devices that no layout-dependent stress parameters were generated in step 105 (e.g., design shapes for which layout-dependent analysis was disabled or not enabled by the control shapes). It should be understood that the stress algorithm may be called as a subroutine in the compact model (see FIG. 5A) or as a standalone program (see FIG. 5B) or as a subroutine in the modified extraction program.

A netlist describes the connectivity of an electronic design. Netlists refer to the features of devices (e.g., body, gate and gate/source/drain contacts of a FET). Each time a device is used in a netlist it is called an "instance" of that particular type of device. If the same device is used ten times there will be ten instances. If each of two different devices is used five and ten times there will be fifteen instances. Instances have pins that have names. Nets are wires that connect the pins together into a circuit. For example, when the device is an FET, the pins are source, drain, gate (and possibly body) contacts. Instance-based netlists (e.g., SPICE or Simulation Program with Integrated Circuit Emphasis, developed at the University of California, Berkeley) provide a list of the instances and a list of net names used in a design. Net-based netlists (e.g., EDIF or Electronic Design Interchange Format) describe all the instances and their attributes, then describe each nets and which pins are connected to each instance.

Netlist extraction is the translation of an integrated circuit layout into a netlist. Different extraction programs may generate a different representation of the netlist depending upon the type of circuit simulation that will utilize the netlist (e.g., static timing analysis, signal integrity, power analysis and optimization and logic-to-layout comparison. Both designed devices (devices deliberately created by the designer) and parasitic devices (devices not explicitly intended by the designer but are inherent in the layer of the circuit) may be extracted.

In a first sense, a compact model is a device model that is Compact Model Council compliant. An example of a compact model is the Berkeley Short-channel IGFET Model (BSIM4) that is compatible with a circuit simulator such as PowerSPICE, developed by IBM Corporation, Hspice, available from Synopsys, Inc., San Jose, Calif., and/or the Cadence Spectre Circuit Simulator, available from Cadence Design Systems, Inc., San Jose, Calif. BSIM. Another example is BSIMPD, which is a compact model for Silicon-on-insulator (SOI) devices. Both compact models are publicly available from the University of California, Berkeley where "PD" denotes "partially-depleted." In a second sense, a compact model is an approximate analytic model that describes the physics of complex 3-dimensional phenomenon in a less complex 2-dimensional description (embodied in an equation, model or algorithm) and in a form that is more easily encoded in software and less computer time intensive, but gives substantially the same results as the exact solution to the complex phenomenon. The term "compact model" is used herein in both senses.

FIGS. 2A, 2B, 2C, 2D, 2E and 2F illustrate application of reduced selective stress enablement according to embodiments of the present invention. A macro is a pre-designed functional circuit that may be placed within a layout of an integrated circuit chip. Macros often have the property of fitting exactly with the bounds of blocks of pre-defined rows and columns of the floor plan of an integrated circuit chip layout. Integrated circuit chips may contain one or more macros. A floor plan is a two dimensional representation of an integrated circuit chip or macro showing the shapes that make up each level positioned on a common grid. The embodiments of the present invention apply to both integrated circuit chip designs and macro designs. In graphics operations, placing is adding data describing a design shape and its coordinates relative to a layout grid to a design data file. Graphics code can be converted to graphical representations. In a graphical representation placing is converting the data to a polygon and showing the polygon in a topological view (e.g., floor plan) of the design. Control shapes "disable" stress modeling by preventing layout-dependent stress parameters to be extracted from the integrated circuit chip or macro design and annotated to the correspondingly extracted netlist or by providing inhibitory signals to the downstream code that implements the stress algorithms. When there are multiple control shapes in a chip design or macro design, the detailed graphics language data of the shape description may differ among the different control shapes so the extraction program could act differently for some or all of multiple control shapes. Buffer regions are electrically inactive layout constructions that introduce dummy design shapes into one or more design levels for the purpose of presenting a continuous or uniform stress environment to devices formed from design shapes overlaid by control shapes. Shapes in buffer regions are "disables" similar to the design shapes in control regions. Though control shapes are illustrated in FIGS. 2A, 2B, 2C, 2D, 2E and 2F as rectangles, control shapes may comprise one or more polygons.

Figure 2A:
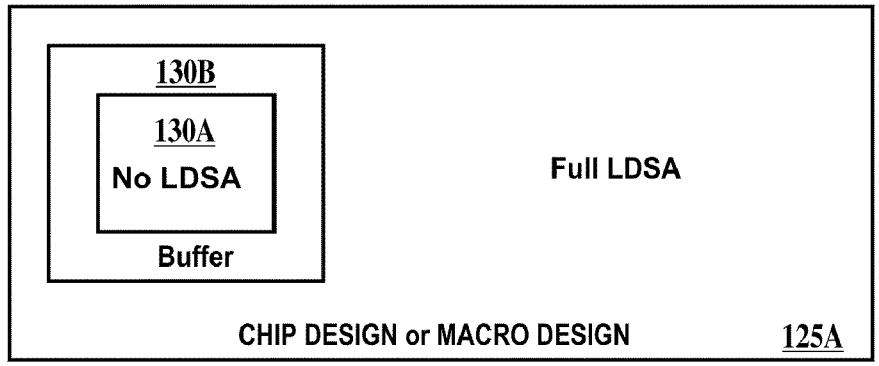
FIGS. 2A, 2B, 2C, 2D, 2E and 2F illustrate application of reduced selective stress enablement according to embodiments of the present invention.
Figure 3:
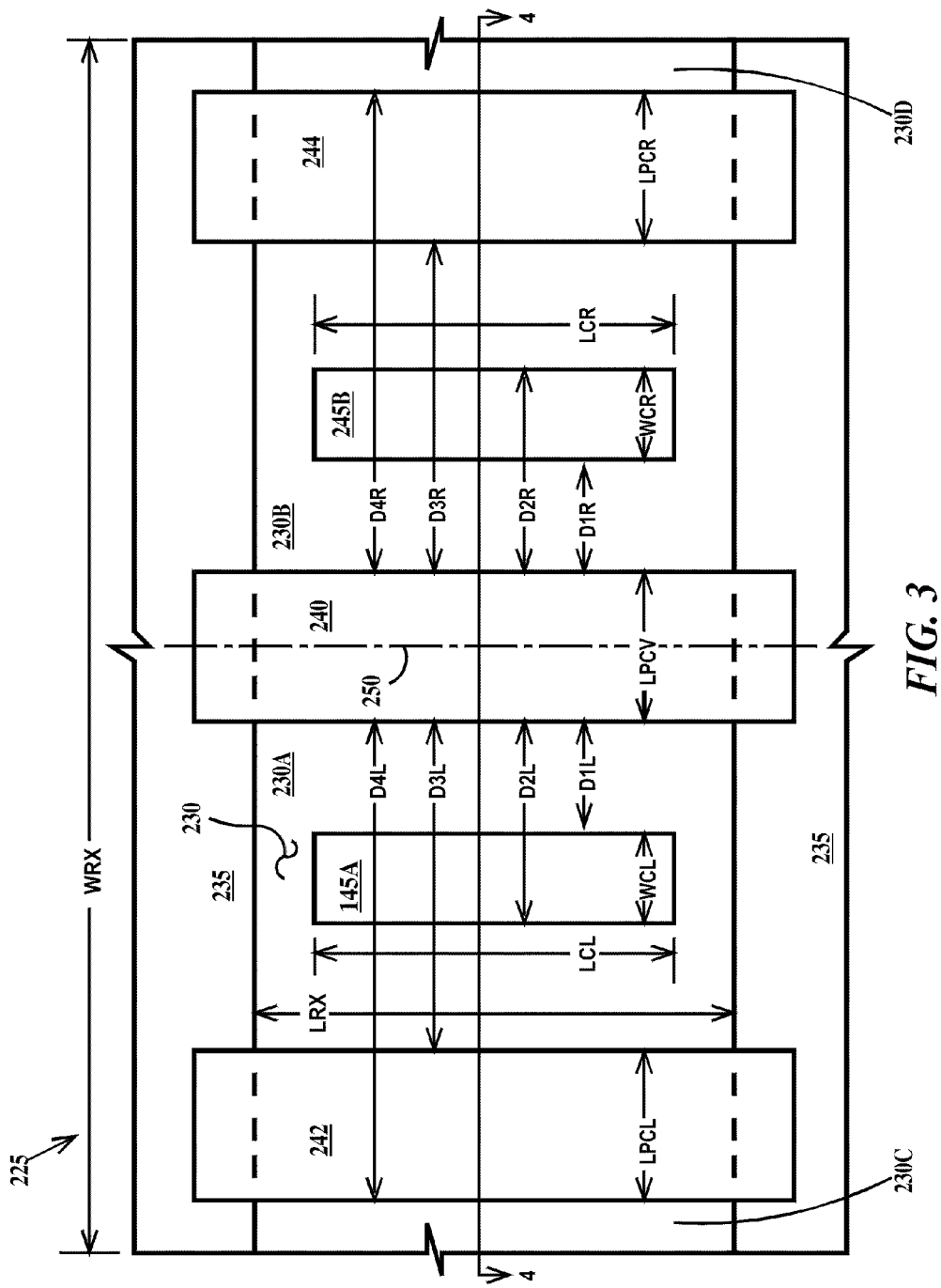
FIG. 3 is a top view of an exemplary stressed FET.

In FIG. 2A an integrated circuit chip design floor plan or macro design floor plan 125A is illustrated. Within floor plan 125A a control shape 130A and an optional buffer region 140B is placed on a floor plan grid. Control shape 130A is surrounded by buffer region 130B. Control shape 130A is a non-design shape. Control shape 130A disables layout-dependent stress analysis (LDSA) and thus engineered stress modeling for all shapes of all design levels completely inside of control shape 130A. Stress modeling is enabled for all design shapes of all design levels outside of control shape 130A. Design shapes that are completely inside control shape 130A are "disabled." Design shapes not completely inside control shape 130A are "enabled." Dummy design shapes in buffer region 130B are "disabled." It should be understood that the terms "inside" and "outside" are not literal, but refer to a process matching layout grid coordinates of the design and control shapes. A design shape is completely "inside" of a control shape (or buffer region) when the graphical representation of the design shape falls completely within (it may touch) the perimeter of a the control shape when the design shape and control shape are projected on the same design grid. While only one control shape 130A and buffer 130B is illustrated in FIG. 2A, there may be multiple control shapes 130A and corresponding buffer regions 130B. However, every control shape 130A need not be surrounded by a buffer 130B.

Figure 2B:
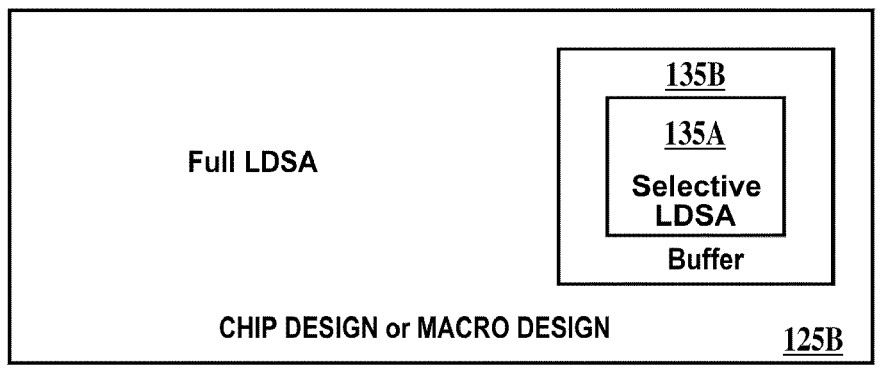

In FIG. 2B, within an integrated circuit chip design floor plan or macro design floor plan 125B, a control shape 135A and optional buffer region 135B are placed on a floor plan grid. Control shape 135A is surrounded by optional buffer region 135B. Control shape 135A is a non-design shape. Control shape 135A disables LDSA for selected design shapes of selected design levels that are completely inside of control shape 135A. Stress modeling is enabled for all design shapes of all design levels outside of control shape 135A. The selected design shapes that are completely within control shape 135A are "disabled." Dummy design shapes of the selected design levels in buffer region 135B are "disabled" and dummy design shapes of the non-selected design levels are "enabled." While only one control shape 135A and buffer 135B is illustrated in FIG. 2B, there may be multiple control shapes 135A and corresponding buffer regions 135B. However, every control shape 135A need not be surrounded by a buffer 135B.

When the device is an FET the layout of the body shape (includes source/drains and the channel of the FET) is defined on RX design level (silicon active area), the layout of gate is defined on a PC design level (polysilicon) and contact openings are defined on an MC design level. When the device is an FET, examples of selected LDSA include (1) passing layout-dependent parameters for RX and PC shapes but not for MC shapes and (2) passing layout-dependent parameters for all RX and MC shapes but a reduced number (not all) of PC the shapes.

Figure 2C:
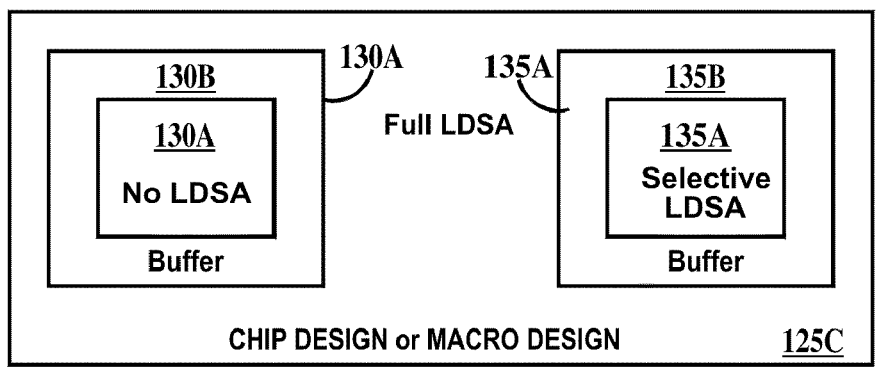

In FIG. 2C, a combination of both first and second control shapes 130A and 135A and optional buffer regions 130B and 135B are placed in an integrated circuit chip design floor plan or macro design floor plan 125C. Note, though only one each of control shapes 130A and 135A and buffer regions 130B and 135B are illustrated, there may be more than one control shape 130A, control shape 135B, buffer region 130B and buffer region 135B. Note, not all control shapes 130A need be surrounded by corresponding buffer regions 130B and not all control shapes 135A need be surrounded by corresponding buffer regions 135B.

Figure 2D:
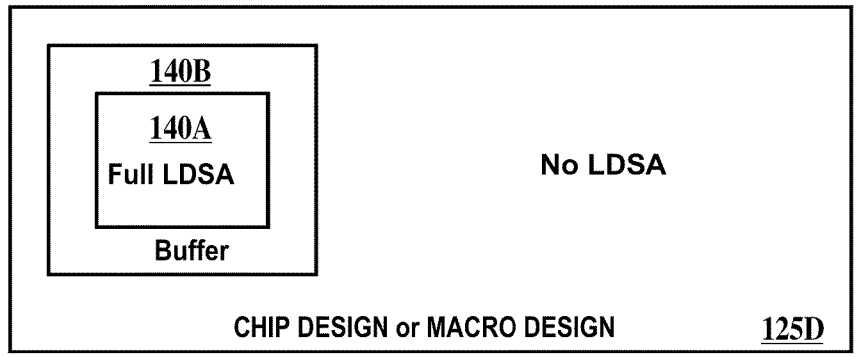

In FIG. 2D the meaning of an enablement control switch is inverted in the extraction program. In FIG. 2D, an integrated circuit chip design floor plan or macro design floor plan 125D includes a control shape 140A that is similar to control shape 130A of FIG. 2A and a buffer region 140B that is similar to buffer regions 130B of FIG. 2A. However, the effect of control shape 140A is the reverse of control shape 130A. Thus, in FIG. 2D, LDSA is disabled for all design shapes completely outside or partially outside of control shape 140A and enabled for design shapes completely inside the perimeter of control shape 140A. Therefore, stress modeling is disabled for all design shapes of all design levels that are completely or partially outside of control shape 140A and enabled for all design shapes that are completely within region 140A. Dummy design shapes in buffer region 140B are "enabled." While only one control shape 140A and buffer 140B is illustrated in FIG. 2D, there may be multiple control shapes 140A and corresponding buffer regions 140B. However, every control shape 140A need not be surrounded by a buffer 140B.

Figure 2E:
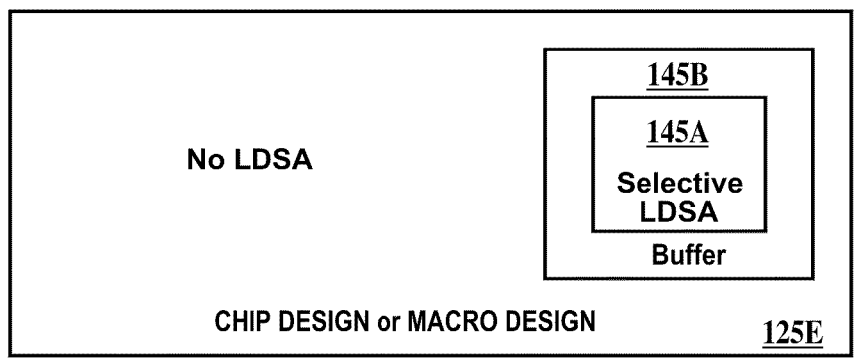

In FIG. 2E the meaning of an enablement control switch is again inverted in the extraction program. Control shape 145A is similar to control shape 135A of FIG. 2B and buffer region 145C is similar to buffer region 135B of FIG. 2B. The effect of control shape 145A is the reverse of control shape 135A. Thus, in FIG. 2E, LDSA is disabled for all design shapes completely outside or partially outside of control shape 145A and enabled for selected design shapes that are completely inside the perimeter of control shape 145A. Therefore, stress modeling is disabled for all design shapes of all design levels that are completely or partially outside of control shape 145A and selectively enabled for selected design shapes that are completely within region 145B. Dummy design shapes of the selected design levels in buffer region 145B are "enabled" and dummy design shapes of the non-selected design levels are "disabled." While only one control shape 145A and buffer 145B is illustrated in FIG. 2E, there may be multiple control shapes 145A and corresponding buffer regions 145B. However, every control shape 145A need not be surrounded by a buffer 145B.

Figure 2F:
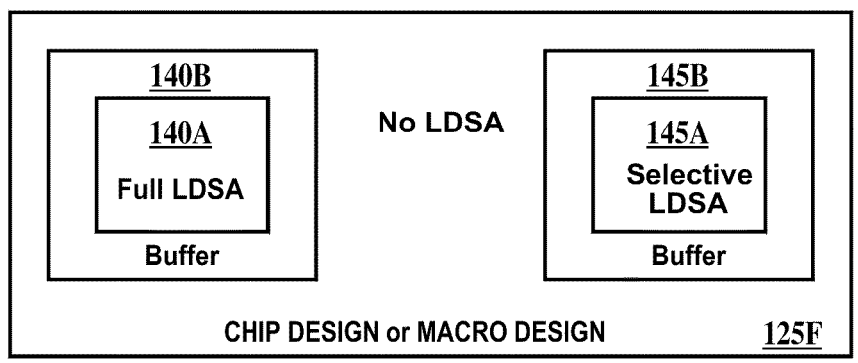

In FIG. 2F, the meaning of an enablement control switch is again inverted in the extraction program and a combination of both control shapes 140A and 145A and optional buffer regions 140B and 145B are placed in an integrated circuit chip design floor plan or macro design floor plan 125F. Note, though only one each of control shapes 140A and 145A and buffer regions 140B and 145B are illustrated, there may be more than one control shape 140A, control shape 145A, buffer region 140B and buffer region 145B. Note, not all control shapes 140A need be surrounded by corresponding buffer regions 140B and not all control shapes 145A need be surrounded by corresponding buffer regions 145B.

The embodiments of the present invention will be described using an FET. Compact modeling based on the layout of the silicon active area (RX level), gate (PC level) and contact openings (MC level) allow relatively accurate stress calculations to be performed. The requirements for modeling the layout dependence of stress induced into the channels of FETs is more straightforward because the design space consists of engineered stress elements such as the body or active area shape as defined by the RX level, adjacent gates in the gate level, cuts in the stress film by contacts of the contact level and the type of stress (tensile or compressive) in the thin-film.

FIG. 3 is a top view of an exemplary stressed FET. FIG. 3 only shows the FET elements defined by the FET body, gate, and contact design levels of an integrated circuit layout. In FIG. 3, an FET 225 includes a semiconductor body region 230 surrounded by shallow trench isolation (STI) 235. The STI and body are both defined by the RX level, being reverse images of each other. Source drain regions 230A, 230B, 230C and 230D are formed in body 230. A victim or device-under-test gate 240 and an adjacent left gate 242 and an adjacent right gate 244 are formed. A metal source/drain left contact 245A is formed to source/drain 230A between victim gate 240 and adjacent gate 242. A metal source/drain right contact 245B is formed to source/drain 230B between victim gate 240 and adjacent gate 244.

When viewed as representing the layout of body, gate and contact shapes of respective body, gate and contact design levels of an integrated circuit layout, FIG. 3 also represents an analytical model of an exemplary FET. Exemplary dimensions of the design shapes (or optionally actual on-chip FET dimensions as derived from other methods such as lithography and process simulation) required as input to the stress algorithm are LRX and WRX which are the dimensions of the silicon body shape, LPCV, LPCL and LPCR which, in conjunction with LRX give the area under the victim, left and right gate shapes respectively, LCR and WCR which give the area of the adjacent right contact shape, and LCL and WCL which give the area of the adjacent left contact shape.

A reference line 250 through the center of victim gate 240 defines leftward D1L, D2L, D3L and D4L and rightward D1R, D2R, D3R and D4R dimensions. D1L, D2L, D3L, D4L, D1R, D2R, D3R and D4R are also inputs to the stress algorithm. In FIG. 3, vertical shape edges are the left and right edges and horizontal edges are the top and bottom shape edges. D1R is the distance between the right edge of the victim gate shape and the left edge of the right contact shape, D2R is the distance between the right edge of the victim gate shape and the right edge of the right contact shape, D3R is the distance between the right edge of the victim gate shape and the left edge of the right gate shape, and D4R is the distance between the right edge of the victim gate shape and the right edge of the right gate shape. D1L is the distance between the left edge of the victim gate shape and the right edge of the left contact shape, D2L is the distance between the left edge of the victim gate shape and the left edge of the left contact shape, D3L is the distance between the left edge of the victim gate shape and the right edge of the left gate shape, and D4L is the distance between the left edge of the victim gate shape and the left edge of the left gate shape.

Together the dimensions LRX, WRX, LPCV, LPCL, LPCLR, LCR, WCR, LCL, WCL, D1L, D2L, D3L, D4L, D1R, D2R, D3R and D4R are inputted to the stress algorithms as layout-dependent stress parameters. It should be understood, that other dimension/distance schemes may be used. For example, dimensions and distances can be measured centerline to centerline and include body, gate and contact lengths and widths.

Figure 4:
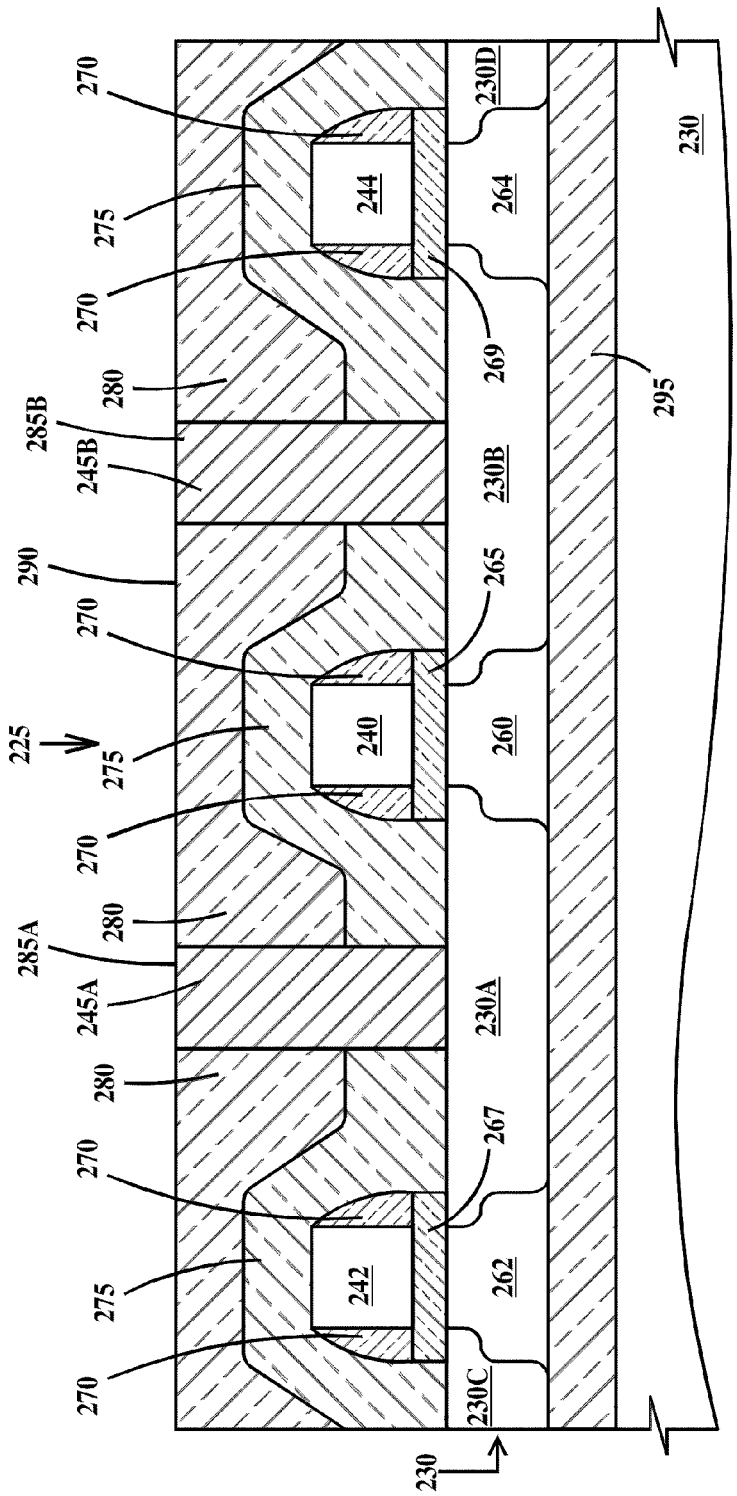
FIG. 4 is a cross-sectional view of the stressed FET of FIG. 3 through line 4-4.

FIG. 4 is a cross-sectional view of the stressed field effect transistor of FIG. 3 through line 4-4. In FIG. 4, a channel 260 is formed in body 230 under victim gate 240 between source/drains 230A and 230B, a channel 262 is formed in body 230 under left gate 242 between source/drains 230C and 230A, and a channel 264 is formed in body 230 under right gate 244 between source/drains 230B and 230D. Victim gate 240 is separated from channel region 260 by a gate dielectric 265, left gate 242 is separated from channel region 262 by a gate dielectric 267, and right gate 244 is separated from channel region 264 by a gate dielectric 269. Dielectric spacers 270 are formed on the sidewalls of gates 240, 242 and 244. A stress film 275 is formed on gates 240, 242, 244, spacers 270 and those regions of body 230 except where contacts 245A and 245B contact source/drains 230A and 230B. A dielectric layer 280 is formed over stress film 275. Top surfaces 285A of contacts and 245A and 245B and top surface 290 of dielectric layer are coplanar. Contacts 245A extend from top surface 290 of dielectric layer 280, through stress film 275 to source/drains 230A and 230B. Also illustrated in FIG. 4 is an optional buried oxide layer (BOX) 295 that is present in silicon-on-insulator (SOI) substrates but not in bulk silicon substrates.

It is the stress induced in channel 260 of FET 225 by stress film 275 as modified by nearby gate and contacts that is calculated by the stress algorithm When FET 225 is an n-channel FET (NFET), channel region 260 is doped P-type, source/drains 230A and 230B are doped N-type and stress film 275 is in tensile stress, which increases electron mobility. When FET 225 is a p-channel FET (PFET), channel region 260 is doped N-type, source/drains 230A and 230B are doped P-type and stress film 275 is in compressive stress, which increases hole mobility. The amount of stress transferred from stress film 275 to body 230 is a function of the structural dimensions of gates 240, 242 and 244 (and spacers 270), the source/drains 230A, 230B, 230C and 230D in contact with stress layer 275 and the area of contacts 245A and 245B in contact in contact with source/drains 230A and 230B respectively. When both PFETS and NFETS are fabricated together, two other design levels (stress film design levels) are passed to the extraction program, one defining the extent of stress film 275 for PFETs and one defining the extent of stress film 275 for NFETs.

In one example, body 230 is single-crystal silicon, gates 240, 242, 244 are polysilicon, stress film 275 is silicon nitride and contacts 245A and 245B comprise tungsten. In FIG. 4, stress film 275 is an engineered stress element. Alternatively, in FIG. 4, stress film 275 may be eliminated and source/drains 230A, 230B, 230C and 230D may include germanium (introduced, for example, by ion implantation) so source/drains 230A, 230B, 230C and 230D are engineered stress elements. Alternatively, in FIG. 4, source/drains 230A, 230B, 230C and 230D may include germanium (introduced, for example, by ion implantation) so source/drains 230A, 230B, 230C and 230D as well as stress film 275 are engineered stress elements.

Figure 5A:
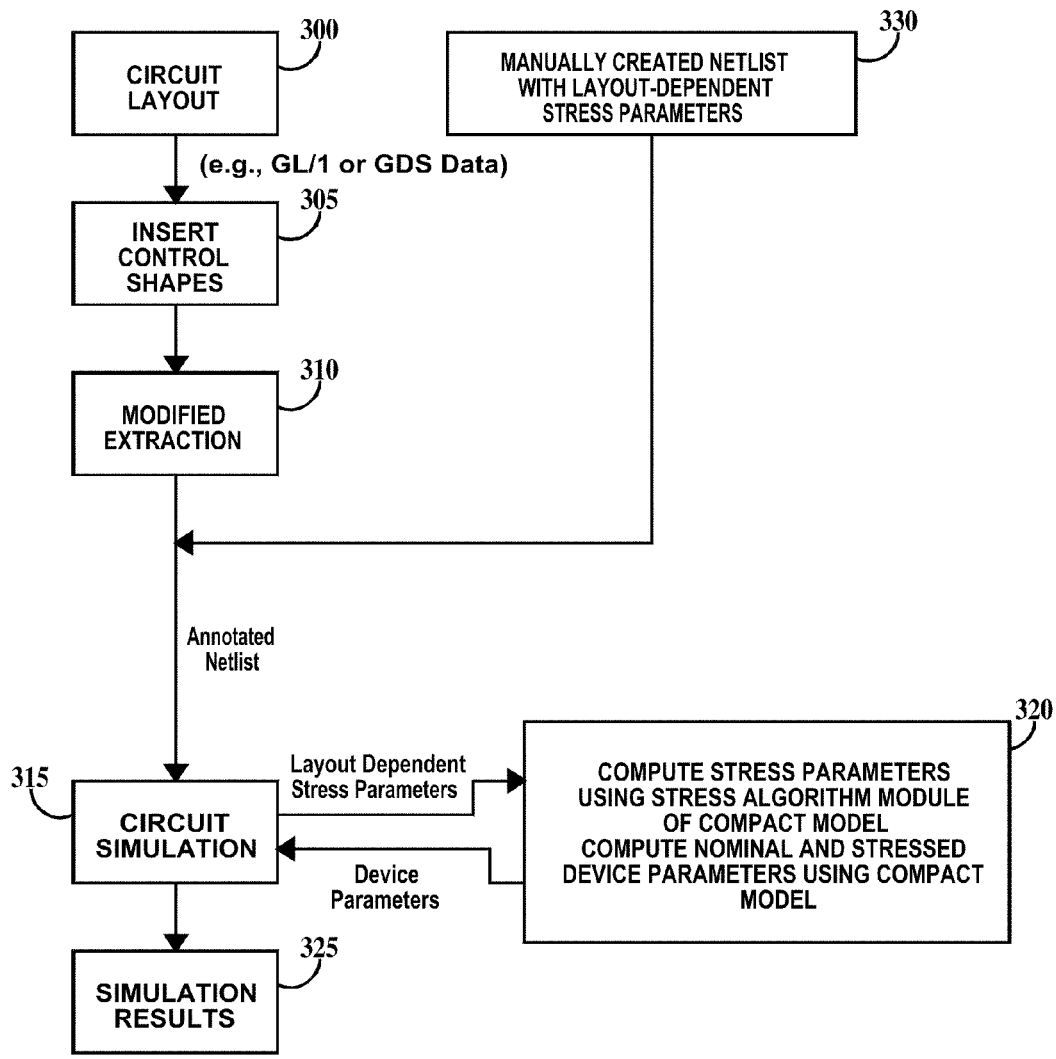
FIGS. 5A and 5B are flowcharts illustrating exemplary embodiments for selective stress simulation modeling of an integrated circuit using compact modeling according to an embodiment of the present invention.
Figure 5B:
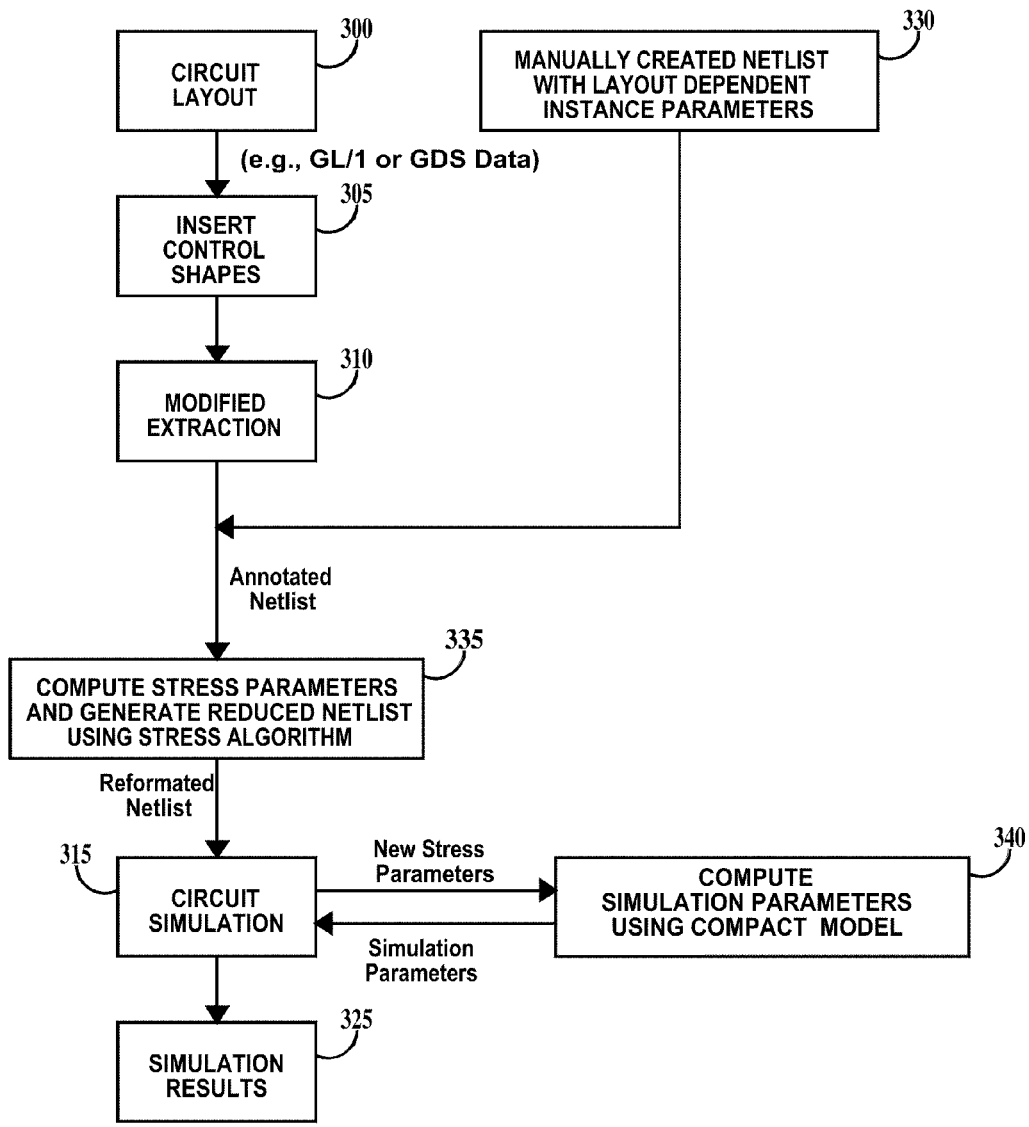

FIGS. 5A and 5B are flowcharts illustrating exemplary embodiments for selective stress simulation modeling of an integrated circuit using compact models according to an embodiment of the present invention. In FIGS. 5A and 5B the present invention is described using an exemplary FET. However, the present invention is applicable to other devices such as bipolar transistors and diodes and in the accompanying descriptions the term "device" may substituted for "FET" with the understanding that an FET is a specific type of device.

Turning to FIG. 5A, in step 300, a representation of an integrated circuit (e.g., circuit layout data in a computer readable format) for the body, gate and contact design levels is received or otherwise provided. In one example the representation of the integrated circuit is in a GL1 or GDSII format. GL1 (Graphics Language 1, developed by IBM Corporation) and GDSII (Graphic Data System version 2, developed by GE CALMA) refer to graphics languages that provide a standard file format for transferring and archiving 2D graphical design data in computer systems. In step 305 control shapes as illustrated in FIGS. 2A, 2B, 2C, 2D, 2E, 2F and combinations thereof are added to the circuit layout.

In step 310, a modified extraction program is executed to provide a netlist annotated with the layout-dependent stress parameters used in the invention including: areas, perimeters, distances and shape vertices. Modified herein means the extraction program is modified to recognize the control shapes and annotate the netlist with layout-dependent stress parameters. In the example of FIG. 3, the layout-dependent stress parameters are LRX, WRX, LPCV, LPCL, LPCR, LCR, WCR, LCL, WCL, D1L, D2L, D3L, D4L, D1R, D2R, D3R and D4R. One example of an extraction program that may be suitably modified is the Efficient Rapid Integrated Extraction (ERIE) parasitic model extraction tool from IBM Corporation which typically provides circuit-level netlists from layout design data and extracts interconnect resistance and capacitance. Other examples of suitable extraction tools are the Calibre tool, available from Mentor Graphics Corp, San Jose, Calif., and the Hercules/Star-RCXT tool, available from Synopsys, Inc., Mountain View, Calif.

The modified extraction tool determine what body, gate and contact shape layout-dependent stress parameters are passed to the circuit simulation program to be invoked in step 315 based on the control design shapes inserted in step 305 as opposed to an un-modified extraction tool that would pass all body, gate and contact shape layout-dependent stress parameters. There are several methods that the modified extraction program may employ to enable or disable design shapes from inclusion in the stress algorithm. In a first example, when in graphics language a property is associated with a control shape is "polygon remove level=all", the extraction program disables all design shapes on all design levels from the region of the integrated circuit or macro layout defined by the control shape and its buffer region from being used by the stress algorithm. In a second example, the property associated with the control shape is "polygon remove level=A, B, C . . . " (where A, B, C are selected design levels such as PC or CA) tells the extraction program to disable only the specified design shapes on the design levels A, B, or C from the region of the integrated circuit or macro layout defined by the control shape and its buffer region from being used by the stress algorithm. In a third example, the shape code "polygon property=remove all," tells the extraction program to disable all stress enablement associated on any design level in the region of the integrated circuit or macro layout defined by the control shape and its buffer region for use by the stress algorithm. For example, PC wires connecting to the gate of an FET could be disabled as well as PC wires not connected to the gate of an FET would be disabled. In a fourth example, the shape code "polygon property=remove X, Y, Z . . . " (where X, Y, Z are specified attributes that can belong to one or more shapes) tells the extraction program to disable only the specified design shapes with properties X, Y, or Z from the region of the integrated circuit or macro layout defined by the control shape and its buffer region from being used by the stress algorithm. For example, PC wires adjacent to a gate (a first property) or contacts adjacent to a gate (a second property) would be disabled. It should be understood that other operations besides "remove" are possible such as "include", "exclude", "intersect", "union", "growth", "shrink", etc as well as other combinations of shape-base operations and property-based operations.

In step 315, the circuit simulation program passes the layout-dependent stress parameters required for stress calculation to the compact model. It should be understood that, optionally, the layout information of the annotated netlist provided by the extraction program may first be compressed into a standard format (an "interface") and that compressed layout information passed to the compact model. This may be needed due to limitations in the way information is passed between the two programs (extractor and compact model). Alternatively, the layout information may be passed from the extraction program to the circuit simulation program and then to the compact model without compression.

In step 320, for instance having LDSA enabled, the stress induced in the channel of the FET by the engineered stress elements is calculated using a stress algorithm sub-routine that is part of the compact model. The compact model generates nominal FET parameters such as carrier mobility that is based on pre-determined nominal stress in the body of the FET. The stress algorithm generates stress coefficients that are then used to adjust the nominal FET parameters to stressed FET parameters. For example, the compact model assumes a nominal mobility of $\mu_o$ for a nominal stress parameter $\delta_o$. The stress algorithm calculates a stress parameter $\delta_s$ based on the layout-dependent stress parameters. Stress parameter $\delta_s$ may include stress in the longitudinal direction (parallel to current flow, e.g., source-to-gate-to drain) and stress in the transverse direction (perpendicular to current flow). Then the compact model calculates a stressed mobility $\mu_s$ according to $\mu_s=\mu_o[f\ \delta_s]$. Of course the nominal and new stress values are functions of various combinations of the layout-dependent stress parameters. The stressed FET parameters (stressed device parameters) generated by the compact model are then passed to the circuit simulation program (of step 315). In step 320, for instance having LDSA enabled, the stressed FET parameters (nominal device parameters plus offsets determined by the compact model with stress algorithms) are passed to the circuit simulation program of step 315. Other stressed FET parameters (e.g., threshold voltage) are similarly calculated.

When the devices are field effect transistors, the stressed device parameters and nominal device parameters may be dependently selected from the group consisting of physical property parameters of channel regions of said field effect transistors, carrier mobilities in said channel regions, threshold voltages, currents and charge.

In step 315, circuit simulation to analyze the electrical performance of various circuit topologies using the stressed FET parameters calculated in step 320 is performed and in step 325 simulation results are generated.

As further illustrated in FIG. 5A, the circuit simulation program of step 315 may receive manually created netlist input that is annotated with layout-dependent stress parameters.

FIG. 5B illustrates an alternative embodiment of layout extraction algorithm according to the invention. The difference between FIGS. 5A and 5B is step 320 of FIG. 5A is replaced with steps 335 and 340 in FIG. 5B. In FIG. 5B, instead of invoking the stress algorithm as a subroutine of the compact model, the stress algorithm is invoked in a standalone software program that functions independently of the compact model. In step 335, the annotated netlist is input to a netlist reformatting program in step 335 that calls the stress algorithm. For instances having LDSA enabled, the stress model algorithm then computes the new stress parameters (e.g., $\delta_s$) based on the layout-dependent stress parameters. The layout-dependent stress parameters are then removed from the annotated netlist and a reformatted netlist including the new stress parameters is passed to the circuit simulator.

In step 315, the reformatted netlist which includes annotated stress parameters generated in step 335 is passed to the circuit simulation program. In step 340, the new stress parameters (e.g., $\delta_s$) are used to order to modify the original or nominal FET model parameters into modified stress model parameters for the compact model. The compact model then uses the new stress model to compute simulation parameters (e.g., currents and charges) needed for circuit simulation.

Alternatively, the netlist reduction program may be part of the extraction program or part of the circuit simulator.

Specific methodology for implementing step 310 of FIGS. 5A and 5B, step 320 of FIG. 5A and step 340 of FIG. 5B as well as exemplary equations for calculating stress based on the layout-dependent stress parameters and equations governing the relationship between compact model parameters (e.g., carrier mobility) and stress are described in U.S. Pat. No. 7,337,420 to Chidambarrao et al. issued Feb. 26, 2008 which is hereby incorporated by reference in its entirety.

Figure 6:
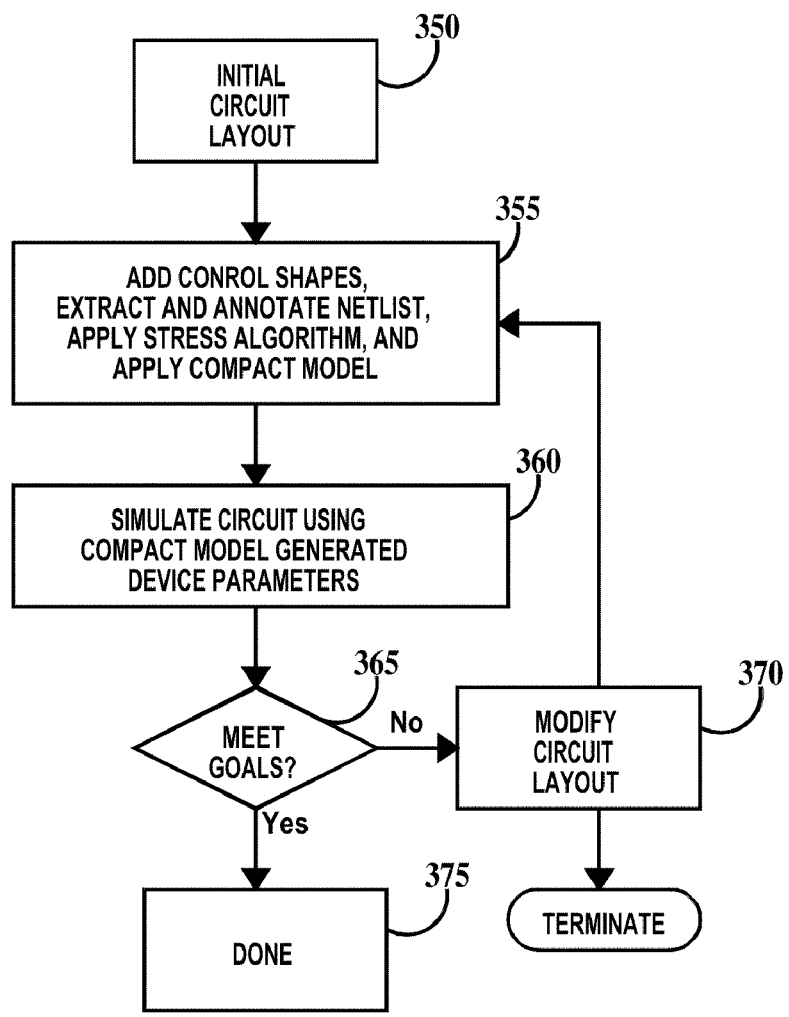
FIG. 6 is a flowchart illustrating selective stress enablement to optimize integrated circuit designs according to the embodiments of the present invention.

FIG. 6 is a flowchart illustrating selective stress enablement to optimize integrated circuit designs according to the embodiments of the present invention. In step 350, an initial circuit layout is provided as described supra with respect to step 305 of FIGS. 5A and 5B. The circuit layout may include, for example, graphical layout data of devices in the circuit. Then, in step 355, control shapes for LDSA enablement/disablement are added to the design, a netlist is extracted and annotated with layout-dependent stress parameters, a stress model algorithm is applied to layout-dependent stress parameters to generate stress parameters, a compact model is applied to the stress parameters to generate nominal and stressed device parameters as described supra with respect to steps 305, 310 and 320 of FIG. 5A and steps 305, 310, 335 and 340 of FIG. 5B. Next, in step 360, a circuit simulation is performed using device parameters generated by the compact model. In step 365 it is determined if circuit performance goals have been met based on the simulation results. An example of a performance goal is signal propagation speed through various circuits of the design. If in step 365, the performance goals have been met, then the process terminates at step 375, otherwise the method proceeds to step 370. In step 370 the circuit design is modified as and the method loops back to 355. Circuit layout modification in step 370 can be done manually or by an automated program. Step 370 includes an option to terminate the process after a certain number of automatic loops through steps 355, 360, 365 and 370 or upon direction of a human operator.

Generally, the method described herein with respect to selective stress enabled models to optimize integrated circuit designs is practiced with a general-purpose computer and the methods described supra in the flow diagrams of FIGS. 1, 5A, 5B, and 6 may be coded as a set of instructions on removable or hard media for use by the general-purpose computer.

Figure 7:
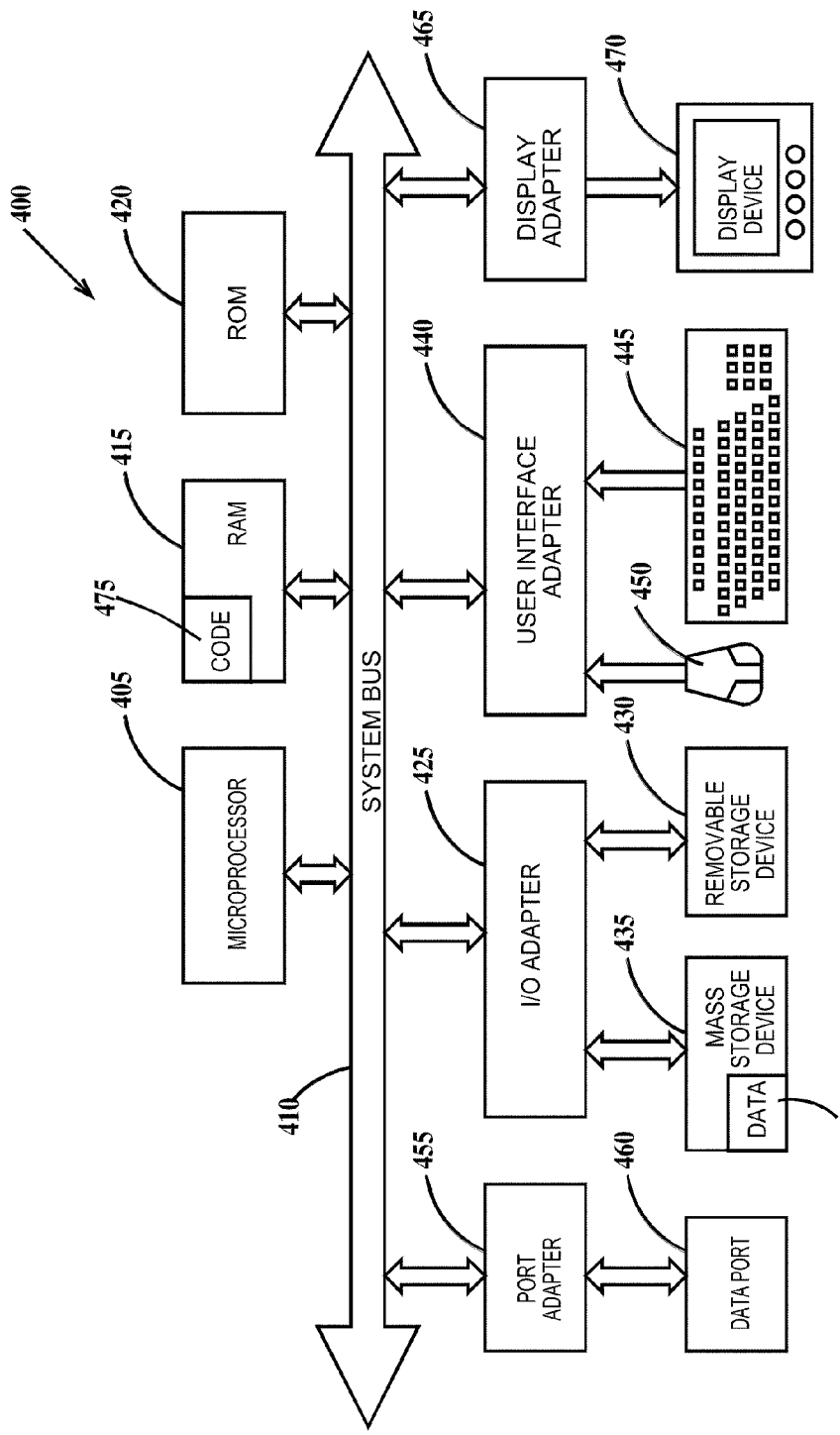
FIG. 7 is a schematic block diagram of a general-purpose computer that may be used to practice the embodiments of the present invention

FIG. 7 is a schematic block diagram of a general-purpose computer that may be used to practice the embodiments of the present invention In FIG. 7, computer system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for a connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

ROM 420 contains the basic operating system for computer system 400. The operating system may alternatively reside in RAM 415 or elsewhere as is known in the art. Examples of removable data and/or program storage device 630 include magnetic media such as floppy drives and tape drives and optical media such as CD ROM drives. Examples of mass data and/or program storage device 435 include electronic, magnetic, optical, electromagnetic, infrared, and semiconductor devices. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

Thus, the embodiments of the present invention provide a method for selective stress enabled modeling to optimize integrated circuit designs.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method for modeling an integrated circuit having devices, comprising:
   (a) converting, by processors of one or more computer systems, a representation of said integrated circuit into design shapes of design levels of a design of said integrated circuit;
   (b) adding, by said processors of said one or more computer systems, control shapes to said design, said control shapes not defining any physical part of said integrated circuit;
   (c) extracting, by said processors of said one or more computer systems, layout-dependent stress parameters of said devices from said design levels of said design based on said control shapes and said design shapes, said devices including one or more engineered stress elements;
   (d) converting, by said processors of said one or more computer systems, said layout-dependent stress parameters to stress parameters using a stress algorithm;
   (e) generating, by said processors of said one or more computer systems, stressed device parameters from said stress parameters using a compact model; and
   (f) simulating, by said processors of said one or more computer systems, performance of said integrated circuit using said stressed device parameters in a simulation model of said integrated circuit design.

2. The method of claim 1, wherein (e) includes using nominal device parameters for devices where no layout-dependent stress parameters were extracted in (c) and (f) further includes simulating performance of said integrated circuit using said nominal device parameters as well as said stressed device parameters.

3. The method of claim 1, wherein method step (c) further includes extracting, by said processors of said one or more computer systems, design shape dimensions and control shape information and said stress-dependent layout parameters include design shape dimensions and dimensions describing distances between design shape features.

4. The method of claim 1, wherein:
   said devices are field effect transistors;
   said layout-dependent stress parameters are dimensions of design shapes of selected levels of said design levels, said selected levels selected from the group of consisting of a body design level, a gate design level, a contact design level, an engineering stress design level and combinations thereof;
   said stress algorithm converts stress induced in said devices by said one or more engineered stress elements into stress parameters based on said layout-dependent stress parameters;
   said compact model generates said stressed device parameters from a function of said stress parameters and a nominal device parameter; and
   (f) further includes simulating performance of said integrated circuit using said nominal device parameters as well as said stressed device parameters.

5. The method of claim 1, wherein extraction of said layout-dependent stress parameters from selected design levels of said integrated circuit design is normally enabled except in regions of a topographical representation of said design where said control shapes are placed where extraction of said layout-dependent stress parameters from all design shapes of selected design levels is disabled.

6. The method of claim 1, wherein extraction of said layout-dependent stress parameters from selected design levels of said integrated circuit design is normally enabled except in regions of a topographical representation of said design where said control shapes are placed and where extraction of said layout-dependent stress parameters from design levels is disabled only for selected design shapes of selected design levels.

7. The method of claim 1, wherein extraction of said layout-dependent stress parameters from selected design levels of said integrated circuit design is normally disabled except in regions of a topographical representation of said design where said control shapes are placed and where extraction of said layout-dependent stress parameters from all design shapes of selected design levels is enabled.

8. The method of claim 1, wherein extraction of said layout-dependent stress parameters from selected design levels of said integrated circuit design is normally disabled except in regions of a topographical representation of said design where said control shapes are placed and where extraction of said layout-dependent stress parameters from design levels is enabled only for selected design shapes of selected design levels.

9. The method of claim 1, wherein:
(e) includes selecting, for devices where no layout-dependent stress parameters were extracted in (c), predetermined nominal device parameters; and
said devices are field effect transistors and said stressed device parameters and nominal device parameters are dependently selected from the group consisting of physical property parameters of channel regions of said field effect transistors, carrier mobilities in said channel regions, threshold voltages, currents and charge.

10. The method of claim 1, further including:
surrounding, by said processors of said one or more computer systems, one or more of said control shapes with a buffer region having dummy design shapes to said design of said integrated circuit and (c) includes extracting layout-dependent stress parameters for said dummy design shapes.

11. The method of claim 1, wherein layout-dependent stress parameters are not extracted from (i) all design shapes of a design level from regions of a design level that are coextensive with said control shapes, said design level shapes and control shapes defined on a common design grid or (ii) selected but not all shapes of a design level from a region of a design level that is coextensive with said control shape, said design level shapes and control shapes defined on a common design grid.

12. A computer system comprising a processor, an address/data bus coupled to said processor, and a computer-readable memory unit coupled to communicate with said processor, said memory unit containing instructions that when executed by the processor implement a method for modeling method an integrated circuit having devices, said devices including one or more engineered stress elements, said method comprising the computer-implemented steps of:
(a) converting a representation of said integrated circuit into design shapes of design levels of a design of said integrated circuit;
(b) adding control shapes to said design, said control shapes not defining any physical part of said integrated circuit;
(c) extracting layout-dependent stress parameters of said devices from said design levels of said design based on said control shapes and said design shapes;
(d) converting said layout-dependent stress parameters to stress parameters using a stress algorithm;
(e) generating stressed device parameters from said stress parameters using a compact model; and
(f) simulating performance of said integrated circuit using said stressed device parameters in a simulation model of said integrated circuit design.

13. The system of claim 12, wherein the method step (e) includes selecting nominal device parameters for devices where no layout-dependent stress parameters were extracted in method step (c) and method step (f) further includes simulating performance of said integrated circuit using said nominal device parameters as well as said stressed device parameters.

14. The system of claim 12, wherein method step (c) further includes extracting design shape and control shape dimensions and said stress-dependent layout parameters include design shape dimensions and dimensions describing distances between design shape features.

15. The system of claim 12, wherein:
said devices are field effect transistors;
said layout-dependent stress parameters are dimensions of design shapes of selected levels of said design levels, said selected levels selected from the group of consisting of a body design level, a gate design level, a contact design level, an engineered stress element design level and combinations thereof;
said stress algorithm converts stress induced in said devices by said engineered stress element into stress parameters based on said layout-dependent stress parameters;
said compact model generates said stressed device parameters from a function of said stress parameters and a nominal device parameter; and
the method step (f) further includes simulating performance of said integrated circuit using said nominal device parameters as well as said stressed device parameters.

16. The system of claim 12, wherein extraction of said layout-dependent stress parameters from selected design levels of said integrated circuit design is normally enabled except in regions of a topographical representation of said design where said control shapes are placed and where extraction of said layout-dependent stress parameters from all design shapes of selected design levels is disabled.

17. The system of claim 12, wherein extraction of said layout-dependent stress parameters from selected design levels of said integrated circuit design is normally enabled except in regions of a topographical representation of said design where said control shapes are placed and where extraction of said layout-dependent stress parameters from design levels is disabled only for selected design shapes of selected design levels.

18. The system of claim 12, wherein extraction of said layout-dependent stress parameters from selected design levels of said integrated circuit design is normally disabled except in regions of a topographical representation of said design where said control shapes are placed and where extraction of said layout-dependent stress parameters from all design shapes of selected design levels is enabled.

19. The system of claim 12, wherein extraction of said layout-dependent stress parameters from selected design levels of said integrated circuit design is normally disabled except in regions of a topographical representation of said design where said control shapes are placed and where extraction of said layout-dependent stress parameters from design levels is enabled only for selected design shapes of selected design levels.

20. The system of claim 12, wherein:
the method step (e) includes selecting, for devices where no layout-dependent stress parameters were extracted in (c), predetermined nominal device parameters; and
said devices are field effect transistors and said stressed device parameters and nominal device parameters are dependently selected from the group consisting of physical property parameters of channel regions of said field effect transistors, carrier mobilities in said channel regions, threshold voltages, currents and charge.

21. The system of claim 12, the method further including:
surrounding one or more of said control shapes with a buffer region having dummy design shapes to said design of said integrated circuit; and
method step (c) includes extracting layout-dependent stress parameters for said dummy design shapes.

22. The system of claim 12, the method not extracting layout-dependent stress parameters from (i) all design shapes of a design level from regions of a design level that are coextensive with said control shapes, said design level shapes and control shapes defined on a common design grid or (ii) selected but not all shapes of a design level from a region of a design level that is coextensive with said control shape, said design level shapes and control shapes defined on a common design grid.

23. A system for modeling an integrated circuit comprising devices, the devices having one or more engineered stress elements inducing stress into said devices, the system comprising:
means for adding control shape data representing control shapes to a computer readable representation of said integrated circuit, said representation of said integrated circuit including computer readable representations of physical designs of said devices, said control shapes not defining any physical part of said integrated circuit;
means for processing said representations of said physical designs of said devices and generating layout-dependent stress parameters of said devices based on said control shape data and said representations of physical designs of said devices;
means for receiving said layout-dependent stress parameters and computing stress parameters for said device;
means for determining nominal stress parameters for devices not having engineered stress elements;
means for generating stressed device parameters from said stress parameters and from said nominal stress parameters;
means for selecting, from said nominal stress parameters, nominal device parameters for devices for which no layout-dependent stress parameters were extracted; and
means for simulating performance of said integrated circuit based on said stressed device parameters and said nominal device parameters.

24. The system of claim 23, wherein:
said means for processing said representations of physical designs of said devices and generating layout-dependent stress parameters of said devices based on said control shape code and said representations of physical designs of said devices comprises a computer executable extraction program;
said means for receiving said layout-dependent stress parameters and computing stress parameters for said devices comprises a computer executable stress algorithm program;
said means for generating stressed device parameters from said stress parameters and nominal stress parameters and for selecting from said nominal stress parameters nominal device parameters for devices for which no layout-dependent stress parameters were extracted comprises a computer executable compact model program;
said means for simulating performance of said integrated circuit based on said stressed device parameters and said nominal device parameters comprises a computer executable circuit simulation program; and
said stress algorithm program is a subroutine of said compact subroutine program.

25. The system of claim 23, wherein:
said means for processing said representations of physical designs of said devices and generating layout-dependent stress parameters of said devices based on said control shape code and said representations of physical designs of said devices comprises a computer executable extraction program;
said means for receiving said layout-dependent stress parameters and computing stress parameters for said devices comprises a computer executable stress algorithm program;
said means for generating stressed device parameters from said stress parameters and nominal stress parameters and for selecting from said nominal stress parameters nominal device parameters for devices for which no layout-dependent stress parameters were extracted comprises a computer executable compact model program;
said means for simulating performance of said integrated circuit based on said stressed device parameters and said nominal device parameters comprises a computer executable circuit simulation program; and
said stress algorithm program is (i) a program that is independent of said extraction program, said compact model program and said simulation program or (ii) is a subroutine within said extraction program, or (iii) is a subroutine in said simulation program.

* * * * *